US009548338B2

(12) United States Patent
Hsu et al.

(10) Patent No.: US 9,548,338 B2
(45) Date of Patent: Jan. 17, 2017

(54) DISPLAY SUBSTRATE AND DISPLAY DEVICE APPLYING THE SAME

(71) Applicant: Innolux Corporation, Miao-Li County (TW)

(72) Inventors: Yi-Hua Hsu, Miao-Li County (TW); Chien-Hsiang Huang, Miao-Li County (TW); Chun-Yu Chen, Miao-Li County (TW)

(73) Assignee: INNOLUX CORPORATION, Miao-Li County (TW)

(*) Notice: Subject to any disclaimer, the term of this patent is extended or adjusted under 35 U.S.C. 154(b) by 0 days.

(21) Appl. No.: 15/241,139

(22) Filed: Aug. 19, 2016

(65) Prior Publication Data

US 2016/0358984 A1 Dec. 8, 2016

Related U.S. Application Data

(63) Continuation of application No. 14/634,975, filed on Mar. 2, 2015, now Pat. No. 9,450,031.

(30) Foreign Application Priority Data

Apr. 23, 2014 (TW) .............................. 103114670 A
Dec. 15, 2014 (TW) .............................. 103143662 A

(51) Int. Cl.
*H01L 27/32* (2006.01)
(52) U.S. Cl.
CPC ....... *H01L 27/3218* (2013.01); *H01L 27/3216* (2013.01)

(58) Field of Classification Search
CPC .......................... H01L 27/3218; H01L 27/3216
See application file for complete search history.

(56) References Cited

U.S. PATENT DOCUMENTS

| 6,867,549 | B2 * | 3/2005 | Cok ..................... G09G 3/3216 |
|           |      |        | 315/169.3 |
| 6,919,681 | B2   | 7/2005 | Cok et al. |
| 7,439,667 | B2   | 10/2008 | Ohtani |
| 7,471,843 | B2   | 12/2008 | Messing et al. |
| 8,330,152 | B2   | 12/2012 | So |

(Continued)

OTHER PUBLICATIONS

TW Office Action dated Dec. 18, 2015 in corresponding Taiwan application (No. 103143662).

*Primary Examiner* — Lex Malsawma
(74) *Attorney, Agent, or Firm* — McClure, Qualey & Rodack, LLP

(57) ABSTRACT

A display substrate and a display device applying the same are provided. The display substrate includes a base plate and a display structure. The display structure is disposed on the base plate and includes first region. The first region includes a first sub-pixel, a second sub-pixel and two third sub-pixels. One of the two third sub-pixels has a first light emitting region having a first end point and a second end point. The other one of the two third sub-pixels has a second light emitting region having a third end point and a fourth end point. The first sub-pixel has a third light emitting region and the second sub-pixel has a fourth light emitting region. The third light emitting region and the fourth light emitting region are inside a quadrilateral region enclosed by the first, second, third and fourth end points.

17 Claims, 10 Drawing Sheets

(56) References Cited

U.S. PATENT DOCUMENTS

| | | | |
|---|---|---|---|
| 8,354,789 B2* | 1/2013 | Kim | H01L 27/3218 |
| | | | 313/504 |
| 9,013,098 B1 | 4/2015 | Kim et al. | |
| 9,439,263 B2* | 9/2016 | Yang | H05B 33/12 |
| 2002/0015110 A1* | 2/2002 | Brown Elliott | G09G 3/3607 |
| | | | 348/589 |
| 2007/0024183 A1 | 2/2007 | Lih et al. | |
| 2008/0117356 A1 | 5/2008 | Oku et al. | |
| 2009/0121983 A1 | 5/2009 | Sung et al. | |
| 2012/0092238 A1 | 4/2012 | Hwang et al. | |
| 2013/0057456 A1 | 3/2013 | Omoto | |
| 2013/0057521 A1 | 3/2013 | Kim | |
| 2015/0123150 A1 | 5/2015 | Adachi | |
| 2015/0123885 A1 | 5/2015 | Adachi | |

* cited by examiner

DISPLAY SUBSTRATE AND DISPLAY DEVICE APPLYING THE SAME

This application is a continuation application of co-pending application Ser. No. 14/634,975, filed on Mar. 2, 2015, which claims the benefits of Taiwan application serial no. 103114670, filed on Apr. 23, 2014, and Taiwan application serial no. 103143662, filed Dec. 15, 2014, the contents of which are incorporated herein by reference.

BACKGROUND OF THE INVENTION

Field of the Invention

The invention relates in general to a display substrate and a display device applying the same, and more particularly to an organic light emitting diode (OLED) display substrate having excellent display quality and an OLED display device applying the same.

Description of the Related Art

An organic light emitting diode (OLED) display is advantageous in thin, active light (without backlight source) and viewing angle free. As expecting higher and higher display quality of electronic products, the image resolution of the OLED display goes higher.

During the process of evaporating the emission layer, a fine metal mask is used for coating individual colors of light emitting films on the pixels. Due to the restrictions of the evaporating process, without considering of suitable tolerance, different colors of emission layers may overlap, making non-uniform, abnormal or color cast of display performance. Therefore, tolerance design of the evaporating process is a crucial factor of producing higher resolution OLED device.

SUMMARY OF THE INVENTION

The invention is directed to a display substrate and a display device applying the same.

According to one embodiment of the present invention, a display substrate is provided. The display substrate includes a base plate and a display structure. The display structure is disposed on the base plate and includes a first region. The first region includes a first sub-pixel, a second sub-pixel and two third sub-pixels. The first sub-pixel and the second sub-pixel are disposed between the two third sub-pixels, the first sub-pixel and the second sub-pixel respectively correspond to two different colors, and the two third sub-pixels correspond to the same color. One of the two third sub-pixels has a first light emitting region, the first light emitting region has a first end point and a second end point, and a first length is a distance between the first end point and the second end point, and the first length is a longest length of the first light emitting region. The other one of the two third sub-pixels has a second light emitting region, and the second light emitting region has a third end point and a fourth end point, a second length is a distance between the third end point and the fourth end point, and the second length is a longest length of the second light emitting region. The first sub-pixel has a third light emitting region and the second sub-pixel has a fourth light emitting region. The third light emitting region and the fourth light emitting region are inside a quadrilateral region enclosed by the first end point, the second end point, the third end point and the fourth end point.

According to another embodiment of the present invention, a display substrate is provided. The display substrate includes a base plate and a display structure. The display structure is disposed on the base plate and includes a first region. The first region includes a first sub-pixel, wherein the first sub-pixel has a first light emitting region; a second sub-pixel, wherein the second sub-pixel has a second light emitting region; and two third sub-pixels, wherein one of the two third sub-pixels has a third light emitting region and the other one of the two third sub-pixels has a fourth light emitting region. The first light emitting region and the second light emitting region are disposed between the third light emitting region and the fourth light emitting region, the first light emitting region and the second light emitting region respectively correspond to two different colors, and the third light emitting region and the fourth light emitting region correspond to the same color. The third light emitting region has a first end point and a second end point, a first length is a distance between the first end point and the second end point, and the first length is a longest length of the third light emitting region. The fourth light emitting region has a third end point and a fourth end point, a second length is a distance between the third end point and the fourth end point, and the second length is a longest length of the fourth light emitting region. The first light emitting region and the second light emitting region are inside a quadrilateral region enclosed by the first end point, the second end point, the third end point and the fourth end point.

According to a further embodiment of the present invention, a display device is provided. The display device includes a display substrate and a cover substrate, and the display substrate is assembled to the cover substrate. The display substrate includes a base plate and a display structure. The display structure is disposed on the base plate and includes a first region. The first region includes a first sub-pixel, wherein the first sub-pixel has a first light emitting region; a second sub-pixel, wherein the second sub-pixel has a second light emitting region; and two third sub-pixels, wherein one of the two third sub-pixels has a third light emitting region and the other one of the two third sub-pixels has a fourth light emitting region. The first light emitting region and the second light emitting region are disposed between the third light emitting region and the fourth light emitting region, the first light emitting region and the second light emitting region respectively correspond to two different colors, and the third light emitting region and the fourth light emitting region correspond to the same color. The third light emitting region has a first end point and a second end point, a first length is a distance between the first end point and the second end point, and the first length is a longest length of the third light emitting region. The fourth light emitting region has a third end point and a fourth end point, a second length is a distance between the third end point and the fourth end point, and the second length is a longest length of the fourth light emitting region. The first light emitting region and the second light emitting region are inside a quadrilateral region enclosed by the first end point, the second end point, the third end point and the fourth end point.

The above and other aspects of the invention will become better understood with regard to the following detailed description of the preferred but non-limiting embodiment(s). The following description is made with reference to the accompanying drawings.

DETAILED DESCRIPTION OF THE INVENTION

According to the display unit of the display substrate disclosed in an embodiment, the peripheral region is formed from the third sub-pixels and the peripheral region surrounds the core region formed from the first sub-pixel and the second pixel, and the sides of the third sub-pixels are adjacent to two sides of the first sub-pixels or the second sub-pixels, such that display defects caused by the non-equidistance in the vertical or the horizontal portion of pixels can be compensated, and the display quality of image can thus be improved. Detailed descriptions of the embodiments of the disclosure are disclosed below with accompanying drawings. In the accompanying diagrams, the same numeric designations indicate the same or similar components. It should be noted that accompanying drawings are simplified so as to provide clear descriptions of the embodiments of the disclosure, and the following detailed description are exemplary and explanatory only and are not restrictive of the disclosed embodiments as claimed. Anyone who is skilled in the technology field of the disclosure can make necessary modifications or variations to the structures according to the needs in actual implementations.

Figure 1A:
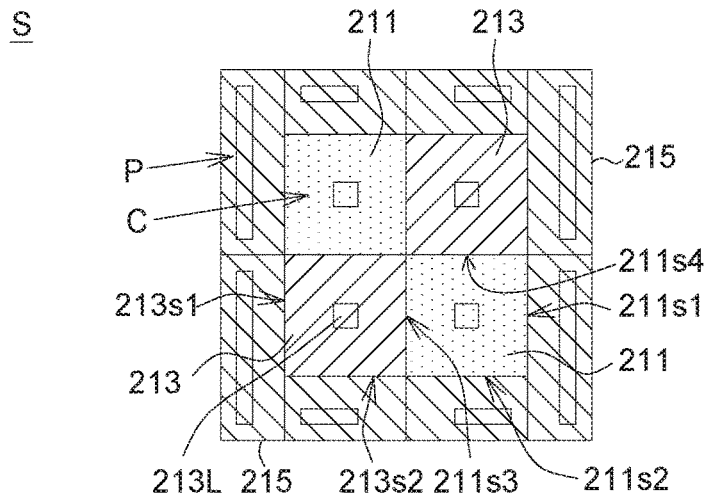
FIG. 1A is a top view of a display unit of a display device according to of the disclosure an embodiment.
Figure 1B:
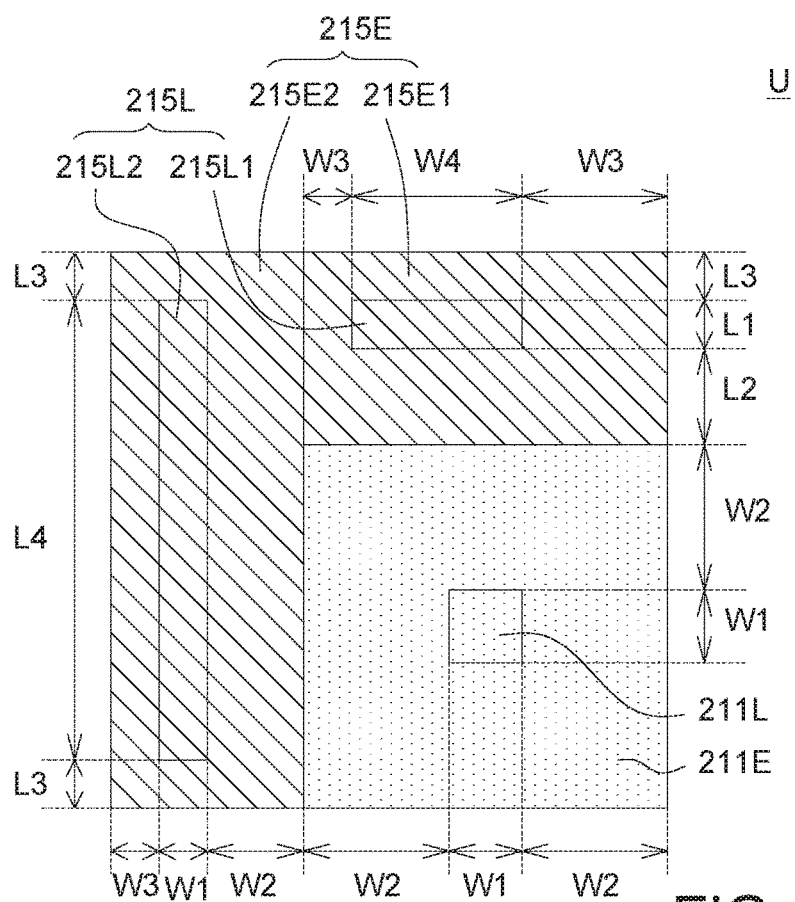
FIG. 1B is a partial enlargement of FIG. 1A.
Figure 1C:
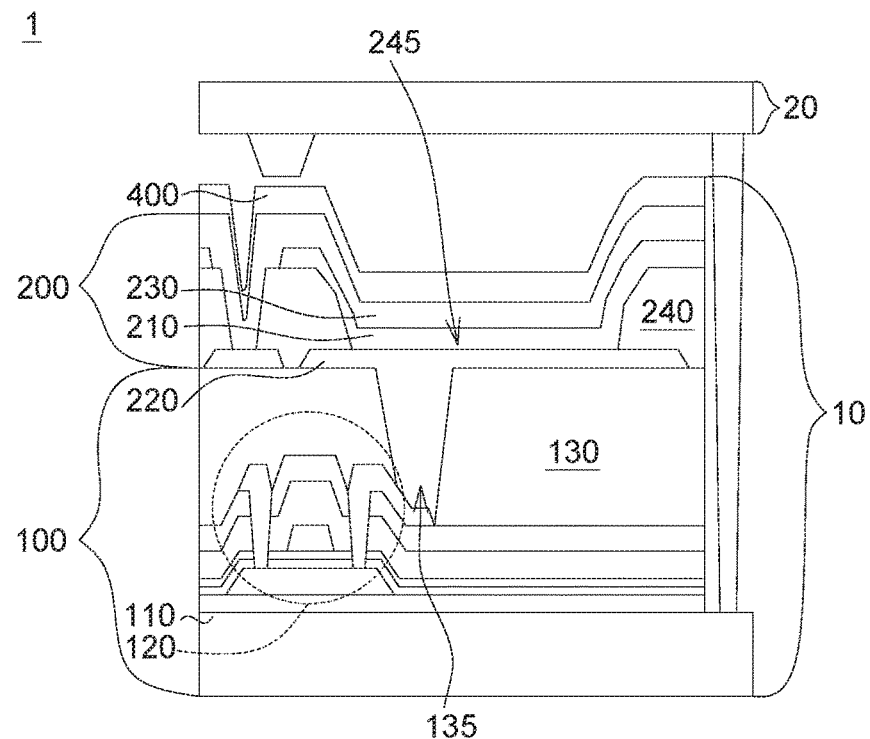
FIG. 1C is a cross-sectional view of a sub-pixel of the display unit FIG. 1A.

FIG. 1A is a top view of a display unit S of a display device 1 according to of the disclosure an embodiment. FIG. 1B is a partial enlargement of FIG. 1A. FIG. 1C is a cross-sectional view of a sub-pixel of the display unit S of FIG. 1A. As indicated in FIG. 1C, the display device 1 includes a display substrate 10 and a cover substrate 20. The cover substrate 20 is jointed to the display substrate 10 to form a display module. The display module is an element of the display device. The display device 1 may further include a drive module (not illustrated) having functions of power supply, signal generation and signal transmission, an optical aided module having optical modulation function or a touch module having touch detection function.

As indicated in FIGS. 1A~1C, the display substrate 10 includes a base plate 100 and a display structure 200. The display structure 200 is disposed on the base plate 100 and includes a substrate and a circuit element layout including such as a thin film transistor, a capacitor, an electrode or a transmission line. The display structure 200 is driven by the base plate 100 and provides signals. The display structure 200 includes a plurality of display units S arranged in an array, and the display units S have a core region C and a peripheral region P. The peripheral region P is located outside the core region C; for example, the peripheral region P may surround the core region C. The core region C includes a pair of first sub-pixels 211 and a pair of second sub-pixels 213. The first sub-pixels 211 and the second sub-pixels 213 are interlaced. Both the first sub-pixels 211 and the second sub-pixels 213 are arranged in a diagonal manner. The overall sub-pixels of the core region C form a Damier shape. The peripheral region P includes at least one third sub-pixel 215. In the present embodiment, the number of third sub-pixels 215 located in the peripheral region P is 8. However, in other embodiments, the number of third sub-pixels 215 located in the peripheral region P can be 1, 2 or 4. The number of third sub-pixels 215 is the same as the number of regions which can be driven and operated independently. One side of the third sub-pixel 215 is adjacent (connected to or contacted with) one side of the first sub-pixel 211 or the second sub-pixel 213. In the present embodiment, one side of the third sub-pixel 215 is adjacent to one side of one of the first sub-pixel 211 or the second sub-pixel 213. The shape of the sub-pixel can be a rectangle, a circle or a polygonal of other shape.

As indicated in FIG. 1B, a first sub-pixel 211 and two third sub-pixels 215 form a pixel U. Similarly, a second sub-pixel 213 and two third sub-pixels 215 also form a pixel U, and four pixels U also form a display unit S. The resolution of the display device 1 is equivalent to the number of pixels U. In the present embodiment, the L-shape formed of two third sub-pixels 215 has a vertical portion and a horizontal portion. The horizontal portion is inserted into the distribution space of the first sub-pixels 211 and the second sub-pixels 213 for compensating the differences in the horizontal intervals and the vertical intervals so as to increase display quality.

Refer to FIG. 1C. In the present embodiment, the base plate 100 includes a substrate 110 and a switch unit 120, or an assembly of active/passive elements and transmission circuit traces. The substrate 110 can be formed of a material such as glass, and plastic, or metal. The switch unit 120 can be realized by a thin-film transistor which controls the ON/OFF of the pixel to display a frame. The structure of the switch unit 120 can be top gate, bottom gate, dual gate or coplanar. The active layer of the switch unit 120 can be formed of amorphous silicon, low temperature poly silicon or a metal oxide semiconductor. The surface of the base plate 100 is covered with a passivation layer, and has a plurality of vias 135 correspondingly exposing one of the source or drain of the switch unit 120 for the purpose of signal transmission.

In the present embodiment, the emission layer 210 emits different primary colors the first sub-pixels 211, the second sub-pixels 213 and the third sub-pixels 215. For instance, the emission layer 210 emits red color R for the first sub-pixels 211, blue color B for the second sub-pixels 213 and green color G for the third sub-pixels 215. However, the colors that the emission layer 210 emits for the first sub-pixels 211, the second sub-pixels 213 and the third sub-pixels 215 can be selected to fit actual needs, and are not limited to the above exemplifications. In the present embodiment, the emission layer 210 of the first sub-pixels 211, the second sub-pixels 213 and the third sub-pixels 215 can be formed of such as an organic light emitting material.

As indicated in FIG. 1C, the display structure 200 (300) includes a first electrode layer 220, a pixel definition layer 240, an emission layer 210, and a second electrode layer 230. The first electrode layer 220 and the second electrode layer 230 clamp the emission layer 210 to form a light-emitting diode sandwich structure. The first electrode layer 220 is formed on the base plate 100 and electrically connected to the switch unit through the vias 135 and can be used as an anode. The first electrode layer 220 is a single-layer or multi-layer structure such as ITO/Ag/ITO and can be formed of metal, alloy or a metal oxide conductor. After the first electrode layer 220 was formed, the pixel definition layer 240 is disposed thereon and has an opening portion 245 correspondingly exposing a portion of the first electrode layer 220. The area of the opening portion 245 is smaller than that of the first electrode layer 220. The emission layer 210 can be formed of an organic light emitting material. The coverage area of the emission layer 210 is smaller than or equivalent to that of the sub-pixel but larger than that of the opening portion 245 or the first electrode layer 220. The actual light emitting area of the emission layer 210 is equivalent to the area of the opening portion 245. The second electrode layer 230 is disposed on the emission layer 210 and can be used as a cathode. The second electrode layer 230 is a single-layer or multi-layer structure such as Mg:Ag alloy and can be formed of metal, alloy or a metal oxide conductor. The display substrate 10 may further include a capping layer 400, which covers the display structure 200.

As indicated in FIG. 1B, sub-pixels 211, 213, 215 has an actual light emitting region, and the area of the light emitting region is defined as the area of the opening portion 245 of the pixel definition layer 240 of a sub-pixel, and the area of the opening portion 245 is the corresponding light emitting areas 211L, 213L and 215L of the light emitting region. Let the pixel U which is formed from the first sub-pixels 211 and the third sub-pixels 215 be taken for example. The emission layer 210 is formed by using the evaporating process. Due to the restrictions of the evaporating process, the actual area of the emission layer 210 is smaller than the area occupied by sub-pixels. In the evaporating process, due to the errors in the aligning precision of the evaporating machine and the accuracy and positioning precision of the opening of the metal mask, part of the area occupied by sub-pixels is reserved as tolerance area of the manufacturing process to avoid the light emitting material of different colors of sub-pixels being erroneously mixed in the manufacturing process and affecting light emitting effect. For instance, in the pixel U, the first sub-pixel 211 has a light emitting region 211L and a tolerance region 211E; the L-shaped third sub-pixel 215 has a light emitting region 215L and a tolerance region 215E. The light emitting region 215L is the sum of the light emitting region 215L1 and the light emitting region 215L2, and the tolerance region 215E is the sum of the tolerance region 215E1 and the tolerance region 215E2. In different manufacturing process, the ratio of the area of the tolerance region to the area of the light emitting region may vary accordingly.

In the present embodiment, the evaporating process is used for exemplary purpose. If two adjacent sub-pixels have the same luminous color, the error width or the error length at the junction is about 5 micrometers (μm). If two adjacent sub-pixels have different luminous colors, the error width or the error length at the junction is about 12 μm. The minimal dimension of the opening allowed by the manufacturing process is about 6 μm. In other words, the error distance between the sub-pixels having the same luminous color can be smaller, but the error distance between the sub-pixels having different luminous colors is larger. According to the embodiment of the disclosure, if the display units S are jointed to each other through the third sub-pixels 215 having the same luminous color, the error distance between sub-pixels can be decreased (for example, from 12 μm to 5 μm), the colors of the sub-pixels in adjacent regions will not be mixed, and the display unit S or the pixel U can be downsized, such that the design of high resolution (High PPI) product can be achieved.

As indicated in FIG. 1B, both the opening width W1 and the opening length L1 of the light emitting region are about 6 μm, both the error width W2 and the error length L2 are about 12 μm, both the error width W3 and the error length L3 are about 5 μm, the opening width W4 of the light emitting region 215L1 is about 13 μm, and the opening length L4 of the light emitting region 215L2 is about 43 μm. Particularly, the third sub-pixels 215 adjacent to the display unit S are jointed to each other, the error width W3 and the error length L3 do not have to be 12 μm and can be decreased to 5 μm, such that the error distance between the display units S can be effectively reduced, and the pixel U can be downsized. Under such circumstance, the pixel U measures 53 μm. If the pixel U is used as a calculation unit of resolution, the number of pixels per inch (actual PPI) is 369. By using specific algorithm allowing adjacent pixels U to share sub-pixels, high resolution effect can be simulated by pixels having low resolution, such that the number of virtual pixels per inch (virtual PPI) of the pixel U can reach as high as 479. The light emitting region 211L of the first sub-pixel 211 occupies 2.6% of total area (the dimension of the opening), and the light emitting region 215L of the third sub-pixel 215 occupies 23.9% of total area (the dimension of the opening). In other words, it is defined that the light emitting region of the first sub-pixel has the first light emitting area, and the light emitting region of the third sub-pixel has the third light emitting area. Under such circumstance, in the present embodiment, the ratio of the first light emitting area to the third light emitting area is about 2.6%:23.9% which approximates 1:10.

In the present embodiment, the pixel U as shown in FIG. 1B has a size of 93 μm with ppi of 273. Compared to a pixel structure having RGB strips with a size of 93 μm with ppi of 273, the aperture ratio of the pixel structure having RGB strips is calculated to be merely 10.6%; in the pixel U of the present embodiment as shown in FIG. 1B, the aperture ratio of the first sub-pixel 211 and the second sub-pixel 213 is calculated to be 48.93%, and the aperture ratio of the third sub-pixel 215 is calculated to be 18.87%, which are both larger than the aperture ratio of the conventional pixel structure having RGB strips.

Likewise, in the present embodiment, since the percentage of total area occupied by the light emitting region 213L of the second sub-pixels 213 is about the same as that occupied by the light emitting region 211L of the first sub-pixels 211, it is defined that the light emitting region of the second sub-pixel has a second light emitting area. Therefore, in the present embodiment, the ratio of the second light emitting area to the third light emitting area is about 2.6%:23.9% which approximates 1:10.

In another embodiment, suppose both the opening width W1 and the opening length L1 of the light emitting region are about 6 μm, both the error width W2 and the error length L2 are about 12 μm, both the error width W3 and the error length L3 are about 6 μm, the opening width W4 of the light emitting region 215L1 is about 12 μm, and the opening length L4 of the light emitting region 215L2 is about 36 μm. Under such circumstance, the pixel U measures 60 μm. By using specific algorithm allowing adjacent pixels U to share sub-pixels, high resolution effect can be simulated by pixels having low resolution, such that the number of virtual pixels per inch (virtual PPI) of the pixel U can reach as high as 416. The light emitting region 211L of the first sub-pixel 211 occupies of 10.53% of total area (the dimension of the opening), and the light emitting region 215L of the third sub-pixel 215 occupies 23.22% of total area (the dimension of the opening). In other words, it is defined that the light emitting region of the first sub-pixel has a first light emitting area, and the light emitting region of the third sub-pixels has a third light emitting area. Under such circumstance, the present embodiment, the ratio of the first light emitting area to the third light emitting area is about 10.53%:23.22% which approximates 1:2.

Likewise, in the present embodiment, since the percentage of total area occupied by the light emitting region 213L of the second sub-pixel 213 is about the same as that occupied by the light emitting region 211L of the first sub-pixel 211, it is defined that the light emitting region of the second sub-pixel has a second light emitting area. Therefore, in the present embodiment, the ratio of the second light emitting area to the third light emitting area is about 10.53%:23.22% which approximates 1:2.

To summarize, according to the above embodiments of the disclosure, the ratio of the first light emitting area to the third light emitting area is about 1:2~1:10, and the ratio of the second light emitting area to the third light emitting area is about 1:2~1:10.

FIGS. 1D~1I are top views of a display unit of a display device according to other embodiments of the disclosure. For elements common to the present embodiment and above embodiments, the same numeric designations are used, and relevant descriptions can be obtained with reference to above disclosure and are not repeated here.

Figure 1D:
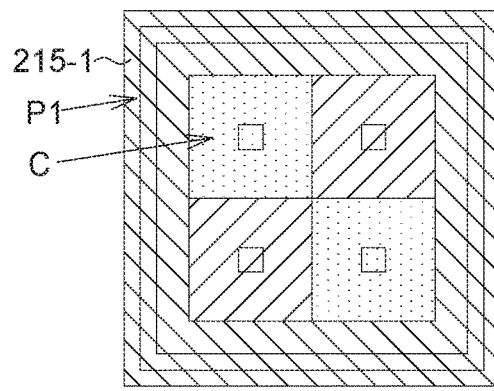
FIGS. 1D~1I are top views of a display unit of a display device according to other embodiments of the disclosure.
Figure 1E:
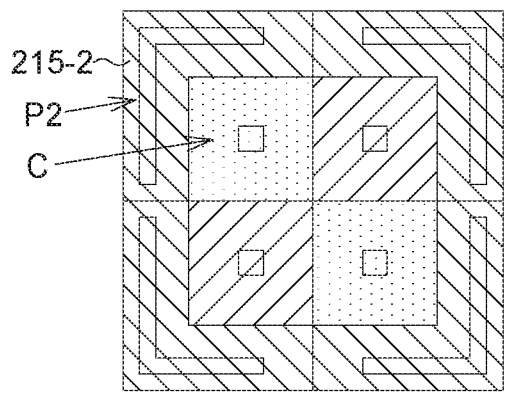
Figure 1F:
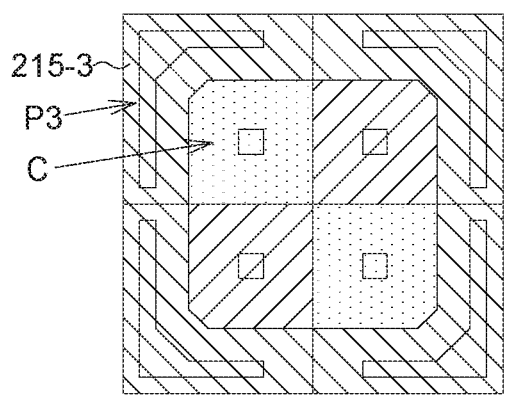

As indicated in FIG. 1D, the peripheral region P1 of the display unit S1 surrounds the core region C, and the number of third sub-pixels 215-1 of the peripheral region P1 is 1. As indicated in FIG. 1E, the peripheral region P2 of the display unit S2 surrounds the core region C, and the number of third sub-pixels 215-2 of the peripheral region P2 is 4. As indicated in FIG. 1F, the peripheral region P3 of the display unit S3 surrounds the core region C, the number of third sub-pixels 215-3 of the peripheral region P3 is 4, and the shape of the third sub-pixels 215-3 is not rectangular.

Figure 1G:
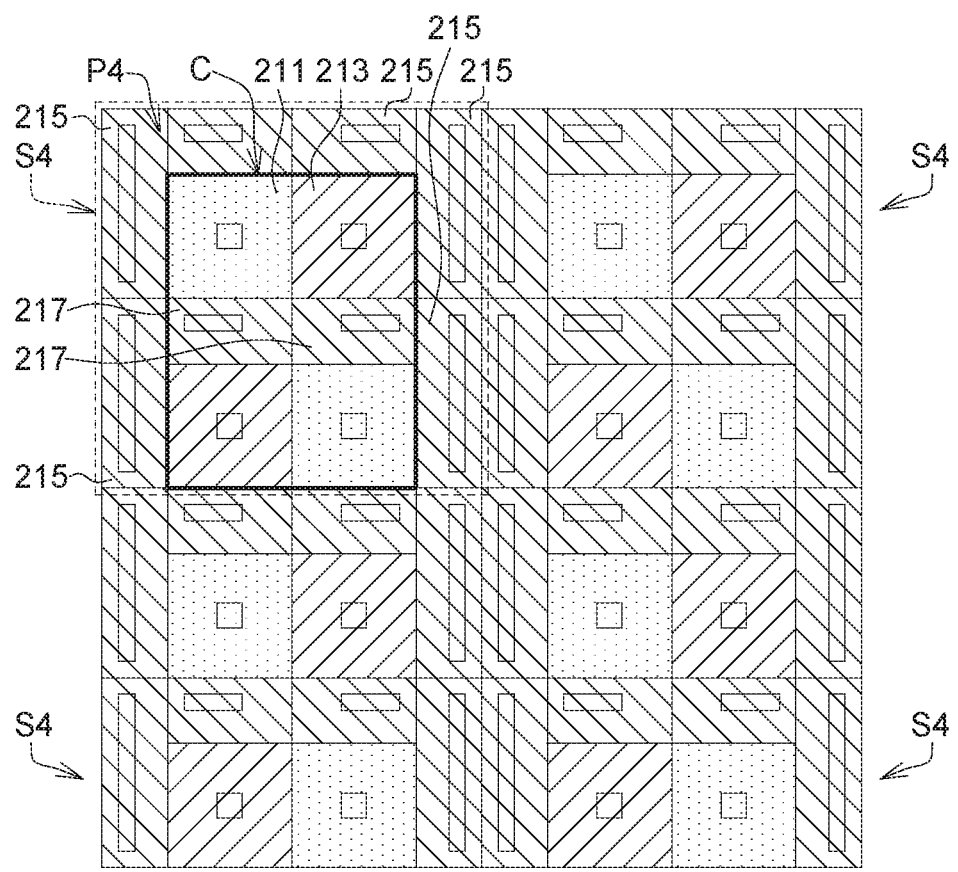

As shown in FIG. 1G, in the present embodiment, in the display unit S4, the core region C includes a plurality of the first sub-pixels 211, a plurality of the second sub-pixels 213, and a plurality of fourth sub-pixels 217. The first sub-pixels 211 and the second sub-pixels 213 are interlacedly arranged. The fourth sub-pixels 217 are respectively located between the one of the first sub-pixels 211 and one of the second sub-pixels 213. The peripheral region P4 includes a plurality of the third sub-pixels 215, and a light emitted by the fourth sub-pixels 217 and a light emitted by the third sub-pixels 215 have the same primary color. For example, as shown in FIG. 1G, one display unit S4 includes two of the first sub-pixels 211, two of the second sub-pixels 213, four of the third sub-pixels 215, and two of the fourth sub-pixels 217, wherein the third sub-pixels 215 of the peripheral region S4 are disposed on three sides of the core region C, and the fourth sub-pixels 217 in the core region C are arranged adjacent to each other. In the embodiment, as shown in FIG. 1G, the display units S4 are arranged repeatedly and regularly in an array on the base plate 100.

Figure 1H:
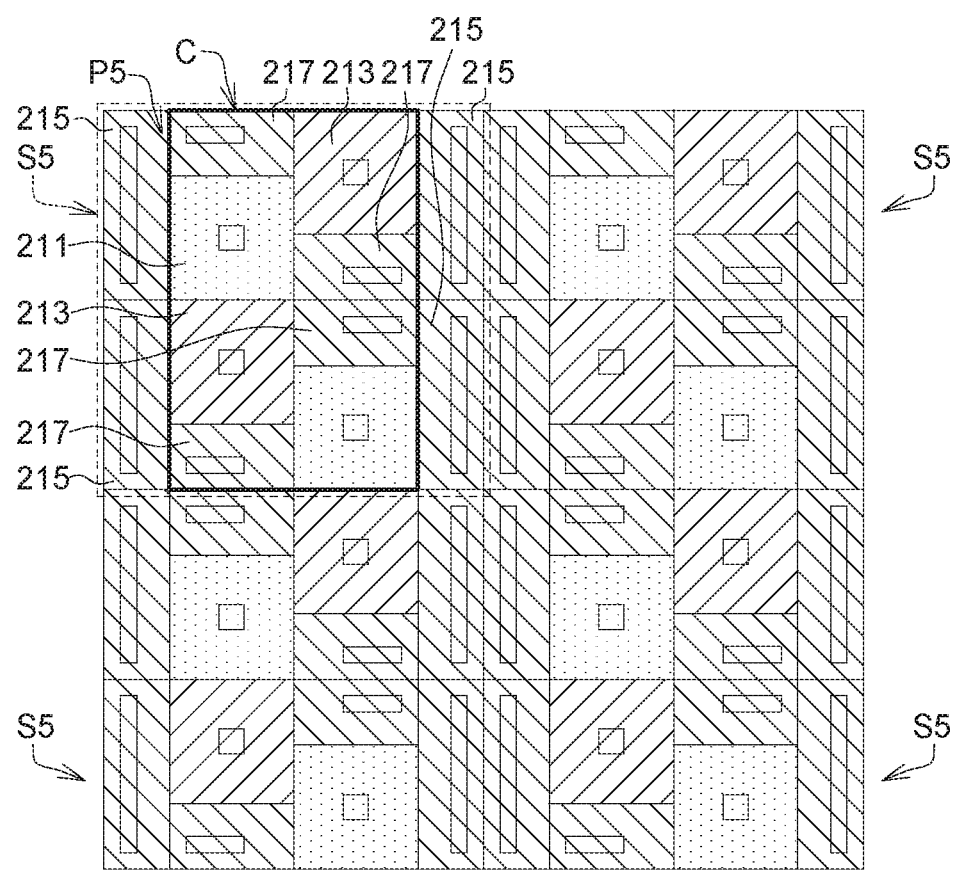

As shown in FIG. 1H, in the present embodiment, in the display unit S5, the core region C includes a plurality of the first sub-pixels 211, a plurality of the second sub-pixels 213, and a plurality of the fourth sub-pixels 217. The first sub-pixels 211 and the second sub-pixels 213 are interlacedly arranged. The fourth sub-pixels 217 are respectively located between the one of the first sub-pixels 211 and one of the second sub-pixels 213. The peripheral region P5 includes a plurality of the third sub-pixels 215, and a light emitted by the fourth sub-pixels 217 and a light emitted by the third sub-pixels 215 have the same primary color. In the display unit S5, as shown in FIG. 1H, the third sub-pixels 215 of the peripheral region P5 are disposed on two opposite sides of the core region C. In one display unit S5, one of the fourth sub-pixels 217, one of the first sub-pixels 211, one of the second sub-pixels 213, and one of the fourth sub-pixels 217 are arranged in order on one of the two opposite sides of the core region C, and one of the first sub-pixels 211, one of the fourth sub-pixels 217, one of the fourth sub-pixels 217, and one of the second sub-pixels 213 are arranged in order on the other one of the two opposite sides of the core region C. In the embodiment, as shown in FIG. 1H, the display units S5 are arranged repeatedly and regularly in an array on the base plate 100.

Figure 1I:
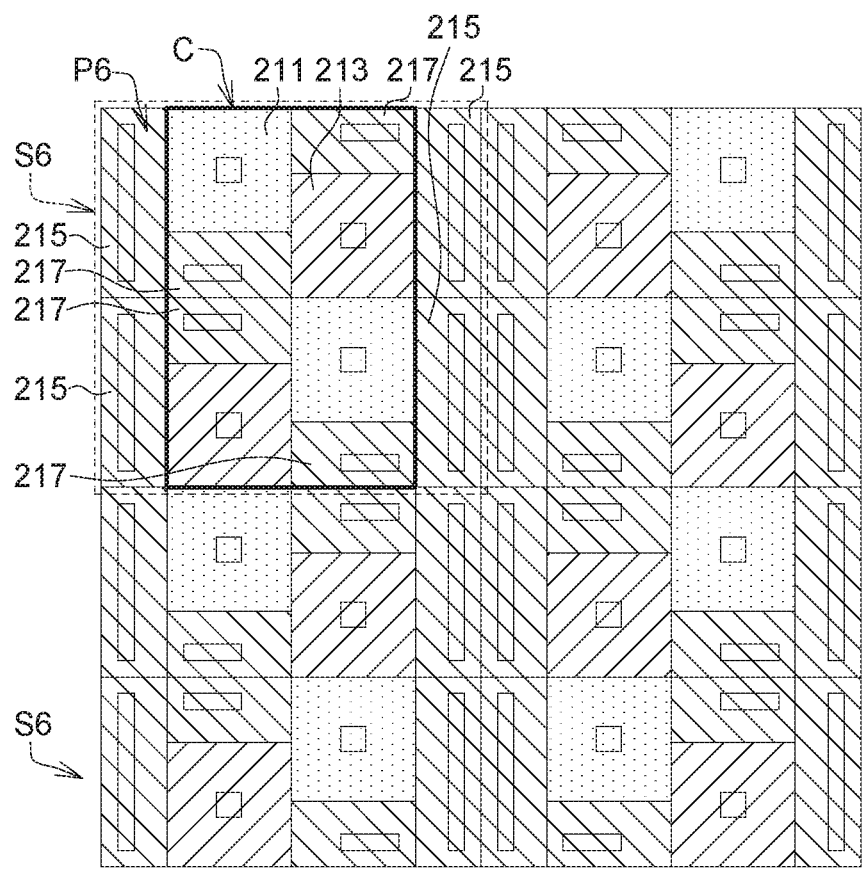

As shown in FIG. 1I, in the present embodiment, in the display unit S6, the core region C includes a plurality of the first sub-pixels 211, a plurality of the second sub-pixels 213, and a plurality of the fourth sub-pixels 217. The first sub-pixels 211 and the second sub-pixels 213 are interlacedly arranged. The fourth sub-pixels 217 are respectively located between the one of the first sub-pixels 211 and one of the second sub-pixels 213. The peripheral region P6 includes a plurality of the third sub-pixels 215, and a light emitted by the fourth sub-pixels 217 and a light emitted by the third sub-pixels 215 have the same primary color. In a display unit S6, as shown in FIG. 1I, the third sub-pixels 215 of the peripheral region P6 are disposed on two opposite sides of the core region C. In one display unit S6, one of the fourth sub-pixels 217, one of the first sub-pixels 211, one of the second sub-pixels 213, and one of the fourth sub-pixels 217 are arranged in order on one of the two opposite sides of the core region C, and one of the first sub-pixels 211, one of the fourth sub-pixels 217, one of the fourth sub-pixels 217, and one of the second sub-pixels 213 are arranged in order on the other one of the two opposite sides of the core region C. In the embodiment, as shown in FIG. 1I, the display units S6 are arranged repeatedly and regularly in an array on the base plate 100. In the array arranged by the display units S6, two of the adjacent display units S6 in two adjacent columns are bilateral symmetric to each other.

The followings are further description of the embodiments. Calculation results of the aperture ratios of the display devices having display units S, S4, S5, and S6 are shown for describing the properties of the display substrates and display devices according to the present disclosure. However, the following embodiments are for illustration only and are not for limiting the scope of the present invention.

Table 1 shows the calculation results of aperture ratios from display devices having sizes of 72.5 μm*72.5 μm and ppi of 350. The aperture ratios of the first sub-pixels 211 and of the second sub-pixels 213 are the same.

TABLE 1

|  | Display unit S | | Display unit S4 | |
| --- | --- | --- | --- | --- |
|  | First sub-pixel/<br>Second sub-pixel | Third<br>sub-pixel | First sub-pixel/<br>Second sub-pixel | Third<br>sub-pixel |
| Aperture<br>ratio (%) | 14.45 | 15.92 | 9.31 | 15.92 |
|  | Display unit S5 | | Display unit S6 | |
|  | First sub-pixel/<br>Second sub-pixel | Third<br>sub-pixel | First sub-pixel/<br>Second sub-pixel | Third<br>sub-pixel |
| Aperture<br>ratio (%) | 14.55 | 14.45 | 14.55 | 14.45 |

Figure 2:
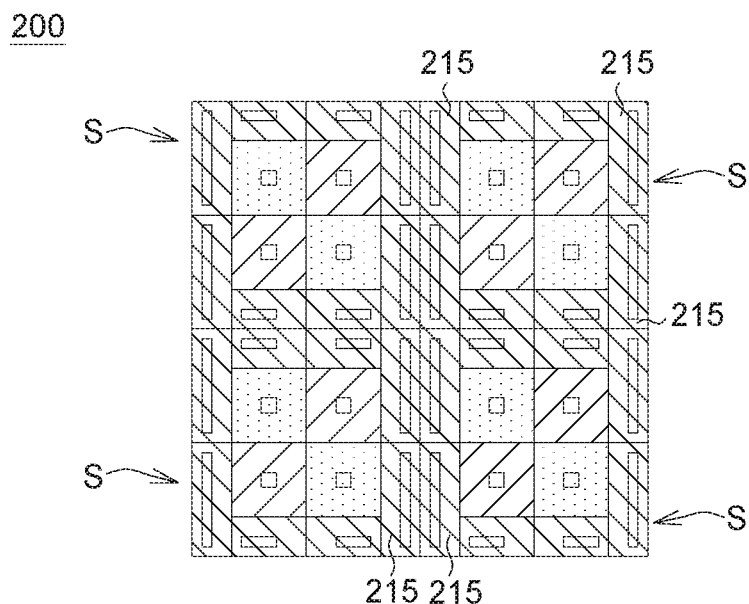
FIG. 2 is a top view of a display unit matrix of a display structure according to another embodiment of the disclosure.

FIG. 2 is a top view of a display unit matrix of a display structure 200 according to another embodiment of the disclosure. In the present embodiment, the display structure 200 may include a plurality of pixels U, and the display units S are repetitively and regularly arranged on the base plate 100 in the form of arrays. As indicated in FIG. 2, the display units S are jointed to each other through the third sub-pixels 215.

Figure 3:
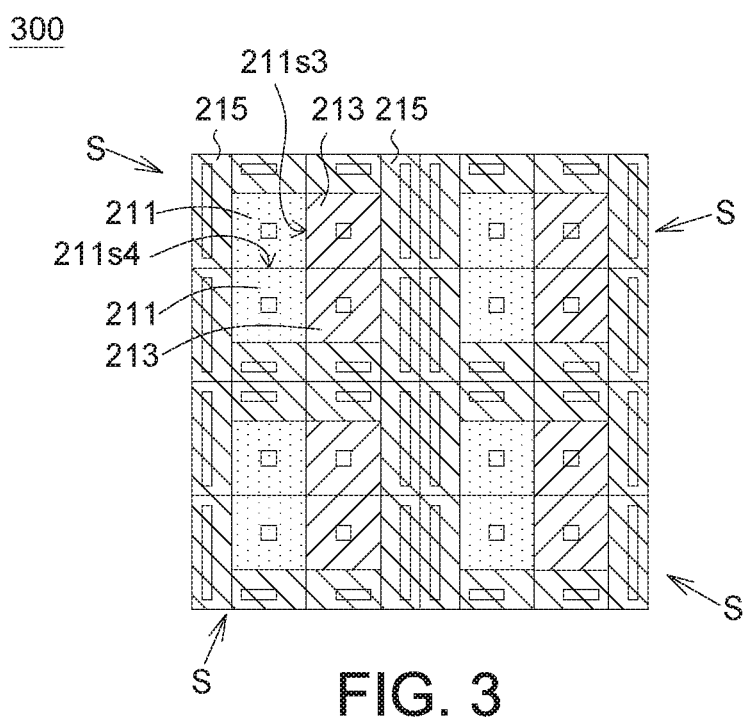
FIG. 3 is a top view of a display unit matrix of a display structure according to an alternate embodiment of the disclosure.

FIG. 3 is a top view of a display unit matrix of a display structure 300 according to an alternate embodiment of the disclosure. For elements common to the present embodiment and above embodiments, the same numeric designations are used, and relevant descriptions can be obtained with reference to above disclosure and are not repeated here.

In an embodiment, the display structure 300 is disposed on the base plate 100 and includes at least one display unit S. As indicated in FIG. 3, the display structure 300 may include a plurality of display units S, which are repeatedly and regularly arranged on the base plate 100. In the display structure 300, the display units S are jointed to each other through the third sub-pixels 215. A display unit S includes, for example, two first sub-pixels 211, two second sub-pixels 213 and four third sub-pixels 215. The first sub-pixels 211 and the second sub-pixels 213 are located in the core region C, and the third sub-pixels 215 are located in the peripheral region.

In the present embodiment, the first sub-pixels 211 are jointed to each other, and so are the second sub-pixels 213 jointed to each other. As indicated in FIG. 3, the first sub-pixels 211 located in the top left part of the pixel structure 310 are jointed to a second sub-pixel 213 and a first sub-pixel 211 through adjacent sides 211s3 and 211s4 respectively.

As indicated in FIG. 1C, the cover substrate 20 can be realized by a glass substrate or a plastic substrate. In an embodiment, the cover substrate 20 may include a plurality of color filters, spacers, electrodes or touch circuits. The color filter enhances the quality of different luminous colors of the sub-pixels of the light emitting unit. In some embodiments, the display substrate 200 and the cover substrate 20 can swap their positions, and in the sub-pixel of the display unit S, the region of the color of emission layer defined by sub-pixels can be replaced by the color filter.

Figure 4A:
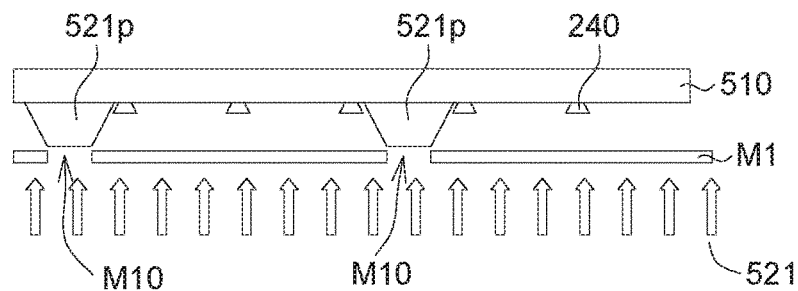
FIGS. 4A~4C are steps of a flowchart of an evaporating process of a light emitting material according to an embodiment.
Figure 4B:
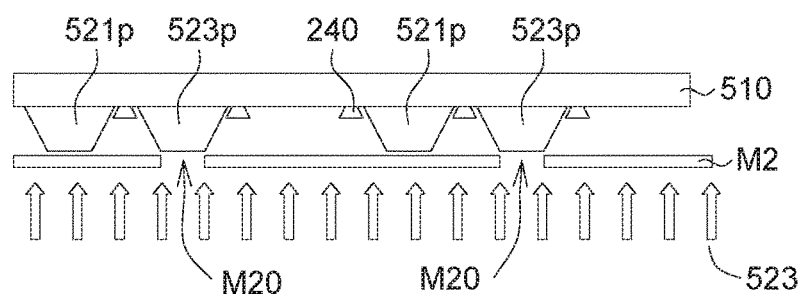
Figure 4C:
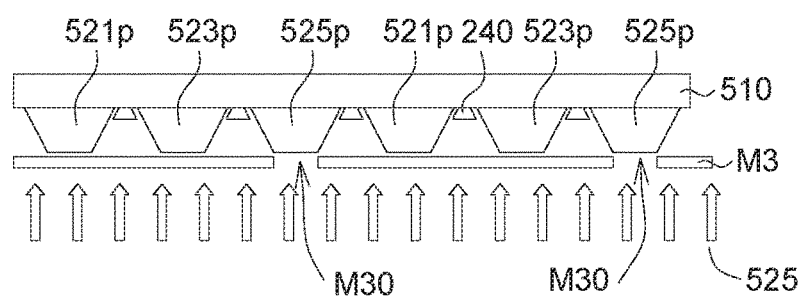

Referring to FIGS. 4A-4C, steps of a flowchart of an evaporating process of a light emitting material according to an embodiment are shown. The process of evaporating several sub-pixels having three luminous colors is exemplified below. As indicated in FIG. 4A, a metal mask M1 having a plurality of openings M10 corresponding to predetermined regions of the first sub-pixels 521p is provided. During the evaporating process, the first light emitting material 521 is evaporated on the predetermined regions through the openings M10. These regions are defined and separated by the pixel definition layer 240. Next, the process proceeds to FIG. 4B, another metal mask M20 having a plurality of openings M20 corresponding to predetermined regions of the second sub-pixel 523p is provided. During the evaporating process, the second light emitting material 523 is evaporated on the predetermined regions through the openings M20. Lastly, as indicated in FIG. 4C, an alternate metal mask M3 having a plurality of openings M30 corresponding to predetermined regions of the third sub-pixels 525p is provided. During the evaporating process, the third light emitting material 525 is evaporated on the predetermined regions through the openings M20.

According to an embodiment of the disclosure, the display units S can be made from a suitable metal mask by using the evaporating process. Referring to FIGS. 5-8, schematic diagrams of a metal mask used for manufacturing a display unit S according to an embodiment of the disclosure are shown.

Figure 5:
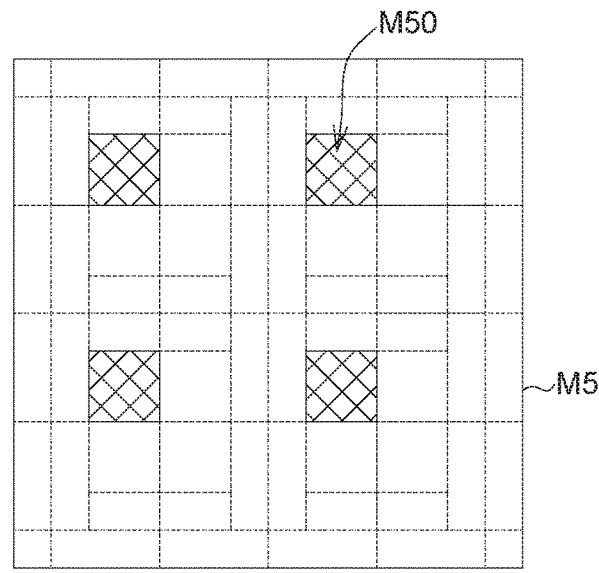
FIGS. 5~8 are schematic diagrams of a metal mask used for manufacturing a display unit according to an embodiment of the disclosure.
Figure 6:
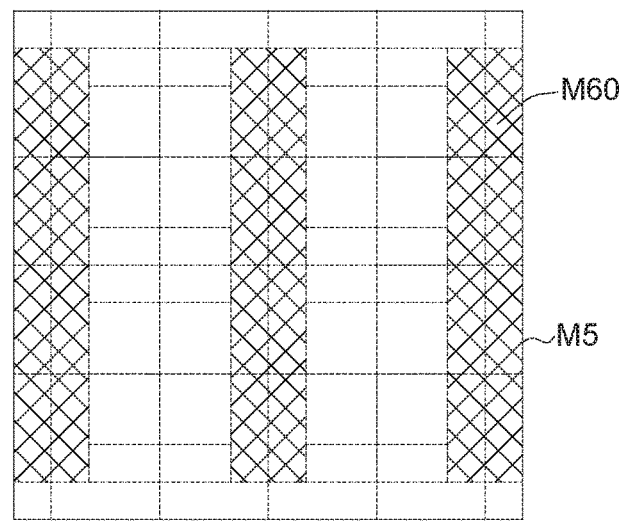
Figure 7:
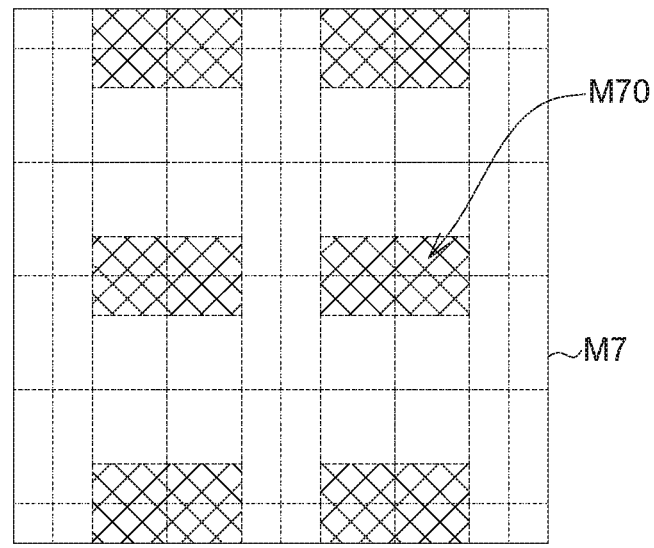

In the present embodiment, the display unit S can be formed by evaporating the metal mask of FIGS. 5-7. For instance, the metal mask M5 of FIG. 5 has a plurality of openings M50, the metal mask M6 of FIG. 6 has a plurality of openings M60, and the metal mask M7 of FIG. 7 has a plurality of openings M70. Two first sub-pixels 211 and two second sub-pixels 213 can be manufactured by performing four times of evaporating process on the metal mask M5. The vertical portion of the L-shaped third sub-pixels 215 can be manufactured by performing one time of evaporating process on the metal mask M6. The horizontal portion of the L-shaped third sub-pixels 215 can be manufactured by performing one time of evaporating process on the metal mask M7. In the present embodiment, the dimension of an opening is equivalent to the sum of the actual light emitting region of a sub-pixel and the tolerance region. Therefore, the dimension of opening of the metal mask can determine sub-pixel dimension, which further determines the dimensions of both the display unit S and the pixel U and affect the resolution level of the display device 1.

Particularly, as indicated in FIG. 6~7, the opening M60/M70 of the metal mask M6/M7 can concurrently be used for manufacturing sub-pixels 215 having the same luminous color of different display units S. Therefore, without increasing the precision condition of the evaporating process, the error distance between the display units S can be decreased, tolerance requirement of the manufacturing process can be effectively reduced, tolerance regions can be shrunk, color mixing of sub-pixels in adjacent regions can be avoided, the problem that the light emitting material is incapable of completely covering corresponding regions of the openings can be resolved, such that the design of high resolution (High PPI) product can be achieved.

Figure 8:
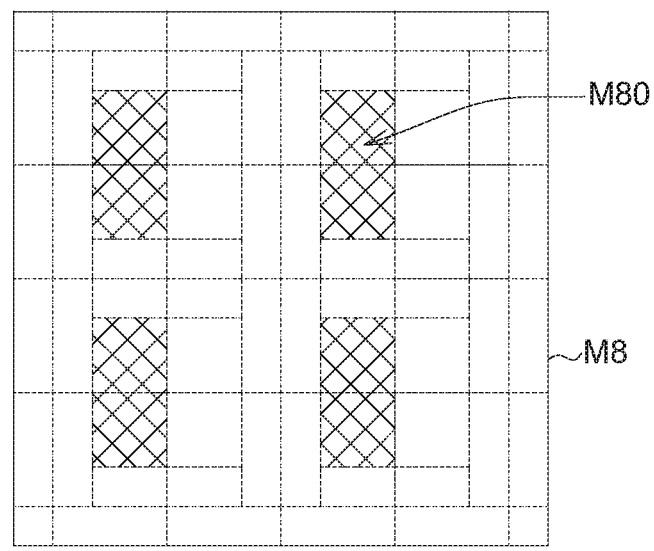

Likewise, the metal mask M8 of FIG. 8 has a plurality of openings M80. Since two first sub-pixels 211 of the display unit S are jointed to each other and so are two second sub-pixels 213 jointed to each other, the required number of evaporating process can be reduced. For instance, two first sub-pixels 211 and two second sub-pixels 213 can be manufactured by performing two times of evaporating process on the metal mask M8. The vertical portion of the L-shaped third sub-pixels 215 can be manufactured by performing one time of evaporating process on the metal mask M6. The horizontal portion of the L-shaped third sub-pixels 215 can be manufactured by performing one time of evaporating process on the metal mask M7. In other words, in the display unit S, the sub-pixel arrangement of jointing two first sub-pixels 211 to each other and jointing two second sub-pixels 213 to each other effectively simplifies the evaporating process.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A display substrate, comprising:
 a base plate; and
 a display structure disposed on the base plate and comprising:

a first region, wherein the first region comprises:
  a first sub-pixel;
  a second sub-pixel; and
  two third sub-pixels;
wherein the first sub-pixel and the second sub-pixel are disposed between the two third sub-pixels, and wherein the first sub-pixel and the second sub-pixel respectively correspond to two different colors, the two third sub-pixels correspond to the same color;
wherein one of the two third sub-pixels has a first light emitting region, the first light emitting region has a first end point and a second end point, and a first length is a distance between the first end point and the second end point, and the first length is a longest length of the first light emitting region;
wherein the other one of the two third sub-pixels has a second light emitting region, and the second light emitting region has a third end point and a fourth end point, a second length is a distance between the third end point and the fourth end point, and the second length is a longest length of the second light emitting region;
wherein the first sub-pixel has a third light emitting region and the second sub-pixel has a fourth light emitting region, and
wherein the third light emitting region and the fourth light emitting region are inside a quadrilateral region enclosed by the first end point, the second end point, the third end point and the fourth end point.

2. The display substrate according to claim 1, further comprising a fourth sub-pixel, wherein the fourth sub-pixel has a fifth light emitting region, the fifth light emitting region is disposed between the first light emitting region and the second light emitting region, and the fifth light emitting region is inside the quadrilateral region.

3. The display substrate according to claim 1, wherein the display structure further comprises:
  a first electrode layer disposed on the base plate;
  a pixel definition layer located on the first electrode layer and having an opening portion;
  a second electrode layer located on the pixel definition layer; and
  an emission layer interposed between the first electrode layer and the second electrode layer;
  wherein an area of the emission layer is larger than the opening portion, and an area of the first electrode layer is larger than the opening portion.

4. The display substrate according to claim 1, wherein a ratio of the third light emitting region or the fourth light emitting region to the first light emitting region is about 1:2-1:10.

5. The display substrate according to claim 1, wherein the third light emitting region and the fourth light emitting region are entirely inside the quadrilateral region.

6. The display substrate according to claim 1, wherein a light emitted by the first sub-pixel is a green light, a light emitted by the second sub-pixel is a red light and lights emitted by the two third sub-pixels are a blue light.

7. A display substrate, comprising:
  a base plate; and
  a display structure disposed on the base plate and comprising:
    a first region, wherein the first region comprises:
      a first sub-pixel, wherein the first sub-pixel has a first light emitting region;
      a second sub-pixel, wherein the second sub-pixel has a second light emitting region; and
      two third sub-pixels, wherein one of the two third sub-pixels has a third light emitting region and the other one of the two third sub-pixels has a fourth light emitting region;
    wherein the first light emitting region and the second light emitting region are disposed between the third light emitting region and the fourth light emitting region, and wherein the first light emitting region and the second light emitting region respectively correspond to two different colors, the third light emitting region and the fourth light emitting region correspond to the same color;
    wherein the third light emitting region has a first end point and a second end point, and a first length is a distance between the first end point and the second end point, and the first length is a longest length of the third light emitting region;
    wherein the fourth light emitting region has a third end point and a fourth end point, a second length is a distance between the third end point and the fourth end point, and the second length is a longest length of the fourth light emitting region; and
    wherein the first light emitting region and the second light emitting region are inside a quadrilateral region enclosed by the first end point, the second end point, the third end point and the fourth end point.

8. The display substrate according to claim 7, further comprising a fourth sub-pixel, wherein the fourth sub-pixel has a fifth light emitting region, the fifth light emitting region is disposed between the third light emitting region and the fourth light emitting region, and the fifth light emitting region is inside the quadrilateral region.

9. The display substrate according to claim 7, wherein the display structure further comprises:
  a first electrode layer disposed on the base plate;
  a pixel definition layer located on the first electrode layer and having an opening portion;
  a second electrode layer located on the pixel definition layer; and
  an emission layer interposed between the first electrode layer and the second electrode layer;
  wherein an area of the emission layer is larger than the opening portion, and an area of the first electrode layer is larger than the opening portion.

10. The display substrate according to claim 7, wherein a ratio of the first light emitting region or the second light emitting region to the third light emitting region is about 1:2-1:10.

11. The display substrate according to claim 7, wherein the first light emitting region and the second light emitting region are entirely inside the quadrilateral region.

12. The display substrate according to claim 7, wherein a light emitted by the first sub-pixel is a green light, a light emitted by the second sub-pixel is a red light and lights emitted by the two third sub-pixels are a blue light.

13. A display device, comprising:
  a cover substrate; and
  a display substrate assembled to the cover substrate, wherein the display substrate comprises:
    a base plate; and
    a display structure disposed on the base plate and comprising:
      a first region, wherein the first region comprises:
        a first sub-pixel, wherein the first sub-pixel has a first light emitting region;
        a second sub-pixel, wherein the second sub-pixel has a second light emitting region; and two third sub-pixels, wherein one of the two third sub-pixels has a third light emitting region and the other one of the two third sub-pixels has a fourth light emitting region;

wherein the first light emitting region and the second light emitting region are disposed between the third light emitting region and the fourth light emitting region, and wherein the first light emitting region and the second light emitting region respectively correspond to two different colors, the third light emitting region and the fourth light emitting region correspond to the same color;

wherein the third light emitting region has a first end point and a second end point, and a first length is a distance between the first end point and the second end point, and the first length is a longest length of the third light emitting region;

wherein the fourth light emitting region has a third end point and a fourth end point, a second length is a distance between the third end point and the fourth end point, and the second length is a longest length of the fourth light emitting region; and wherein the first light emitting region and the second light emitting region are inside a quadrilateral region enclosed by the first end point, the second end point, the third end point and the fourth end point.

14. The display substrate according to claim 13, further comprising a fourth sub-pixel, wherein the fourth sub-pixel has a fifth light emitting region, the fifth light emitting region is disposed between the third light emitting region and the fourth light emitting region, and the fifth light emitting region is inside the quadrilateral region.

15. The display substrate according to claim 13, wherein the display structure further comprises:
a first electrode layer disposed on the base plate;
a pixel definition layer located on the first electrode layer and having an opening portion;
a second electrode layer located on the pixel definition layer; and
an emission layer interposed between the first electrode layer and the second electrode layer;
wherein an area of the emission layer is larger than the opening portion, and an area of the first electrode layer is larger than the opening portion.

16. The display substrate according to claim 13, wherein the first light emitting region and the second light emitting region are entirely inside the quadrilateral region.

17. The display substrate according to claim 13, wherein a light emitted by the first sub-pixel is a green light, a light emitted by the second sub-pixel is a red light and lights emitted by the two third sub-pixel are a blue light.

* * * * *